(12) United States Patent
Hayashi (10) Patent No.: US 8,604,432 B2
(45) Date of Patent: Dec. 10, 2013

(54) DEFECT INSPECTION APPARATUS AND DEFECT INSPECTION METHOD

(75) Inventor: Hiroyuki Hayashi, Yokkaiohi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,980

(22) Filed: Aug. 31, 2012

(65) Prior Publication Data

US 2013/0248705 A1 Sep. 26, 2013

(30) Foreign Application Priority Data

Mar. 23, 2012 (JP) ................................. 2012-068060

(51) Int. Cl.
*H01J 37/28* (2006.01)

(52) U.S. Cl.
USPC ........... 250/311; 250/306; 250/307; 250/310; 250/397; 250/492.1

(58) Field of Classification Search
USPC .............. 250/306, 307, 310, 311, 397, 492.1, 250/492.2, 492.3
See application file for complete search history.

(56) References Cited

U.S. PATENT DOCUMENTS

| | | | |
|---|---|---|---|
| 6,038,018 A * | 3/2000 | Yamazaki et al. ......... | 356/237.1 |
| 6,888,138 B2 * | 5/2005 | Ohshima et al. ........... | 850/9 |
| 7,247,849 B1 * | 7/2007 | Toth et al. .................. | 250/307 |
| 7,449,898 B2 | 11/2008 | Honda et al. | |
| 7,656,171 B2 * | 2/2010 | Honda et al. .............. | 324/754.22 |
| 7,912,657 B2 * | 3/2011 | Shemesh et al. ................. | 702/40 |
| 7,928,384 B2 * | 4/2011 | Cheng et al. .................... | 250/310 |
| 8,274,048 B2 * | 9/2012 | Ikegami et al. ................ | 250/311 |
| 2002/0134936 A1 * | 9/2002 | Matsui et al. .................. | 250/310 |
| 2005/0045820 A1 * | 3/2005 | Ohshima et al. .............. | 250/310 |
| 2008/0116375 A1 * | 5/2008 | Ikegami et al. ............... | 250/307 |
| 2009/0057557 A1 * | 3/2009 | Cheng et al. .................... | 250/310 |
| 2012/0153145 A1 * | 6/2012 | Cheng et al. .................. | 250/307 |

FOREIGN PATENT DOCUMENTS

| | | |
|---|---|---|
| JP | 2007-003539 | 1/2007 |
| JP | 2007-256125 | 10/2007 |
| JP | 2011-174858 | 9/2011 |

* cited by examiner

*Primary Examiner* — Michael Logie
(74) *Attorney, Agent, or Firm* — Oblon, Spivak, McClelland, Maier & Neustadt, L.L.P.

(57) ABSTRACT

In accordance with an embodiment, a defect inspection apparatus includes a charged beam irradiation unit, a detection unit, an energy filter, and an inspection unit. The charged beam irradiation unit generates a charged beam and irradiates a sample including a pattern as an inspection target thereon with the generated charged beam. The detection unit detects secondary charged particles or reflected charged particles generated from the sample by irradiation of the charged beam and outputs a signal. The energy filter is arranged between the detection unit and the sample to selectively allow the secondary charged particles or the reflected charged particles with energy associated with an applied voltage to pass therethrough. The inspection unit applies voltages different from each other to the energy filter and outputs information concerning a defect of the pattern from an intensity difference between signals obtained under application voltage different from each other.

19 Claims, 8 Drawing Sheets

DEFECT INSPECTION APPARATUS AND DEFECT INSPECTION METHOD

CROSS REFERENCE TO RELATED APPLICATIONS

This application is based upon and claims the benefit of priority from the prior Japanese Patent Application No. 2012-068060, filed on Mar. 23, 2012, the entire contents of which are incorporated herein by reference.

FIELD

Embodiments described herein relate generally to a defect inspection apparatus and a defect inspection method.

BACKGROUND

In recent years, an aspect ratio of a pattern is increased with advancement of integration degrees of semiconductor devices. A conventional defect inspection apparatus using an electron beam cannot detect an electrical short circuit that is present, for example, on a bottom between wiring lines, in a high-aspect structure.

BRIEF DESCRIPTION OF THE DRAWINGS

FIG. 3 is a view showing each example of a trajectory of secondary electrons/reflected electrons and an obtained potential contrast image when an energy filter is turned on;

FIG. 8 is a view showing each example of a trajectory of secondary electrons/reflected electrons and an obtained potential contrast image when an energy filter is turned on;

DETAILED DESCRIPTION

In accordance with an embodiment, a defect inspection apparatus includes a charged beam irradiation unit, a detection unit, an energy filter, and an inspection unit. The charged beam irradiation unit is configured to generate a charged beam and irradiate a sample including a pattern as an inspection target thereon with the generated charged beam. The detection unit is configured to detect secondary charged particles or reflected charged particles generated from the sample by irradiation of the charged beam and to output a signal; The energy filter is arranged between the detection unit and the sample and configured to selectively allow the secondary charged particles or the reflected charged particles with energy associated with an applied voltage to pass therethrough; The inspection unit is configured to apply voltages different from each other to the energy filter and to output information concerning a defect of the pattern from an intensity difference between signals obtained under application voltage different from each other.

Embodiments will now be explained with reference to the accompanying drawings. Like components are provided with like reference signs throughout the drawings and repeated descriptions thereof are appropriately omitted.

(A) Embodiment 1

(1) Defect Inspection Apparatus

Figure 1:
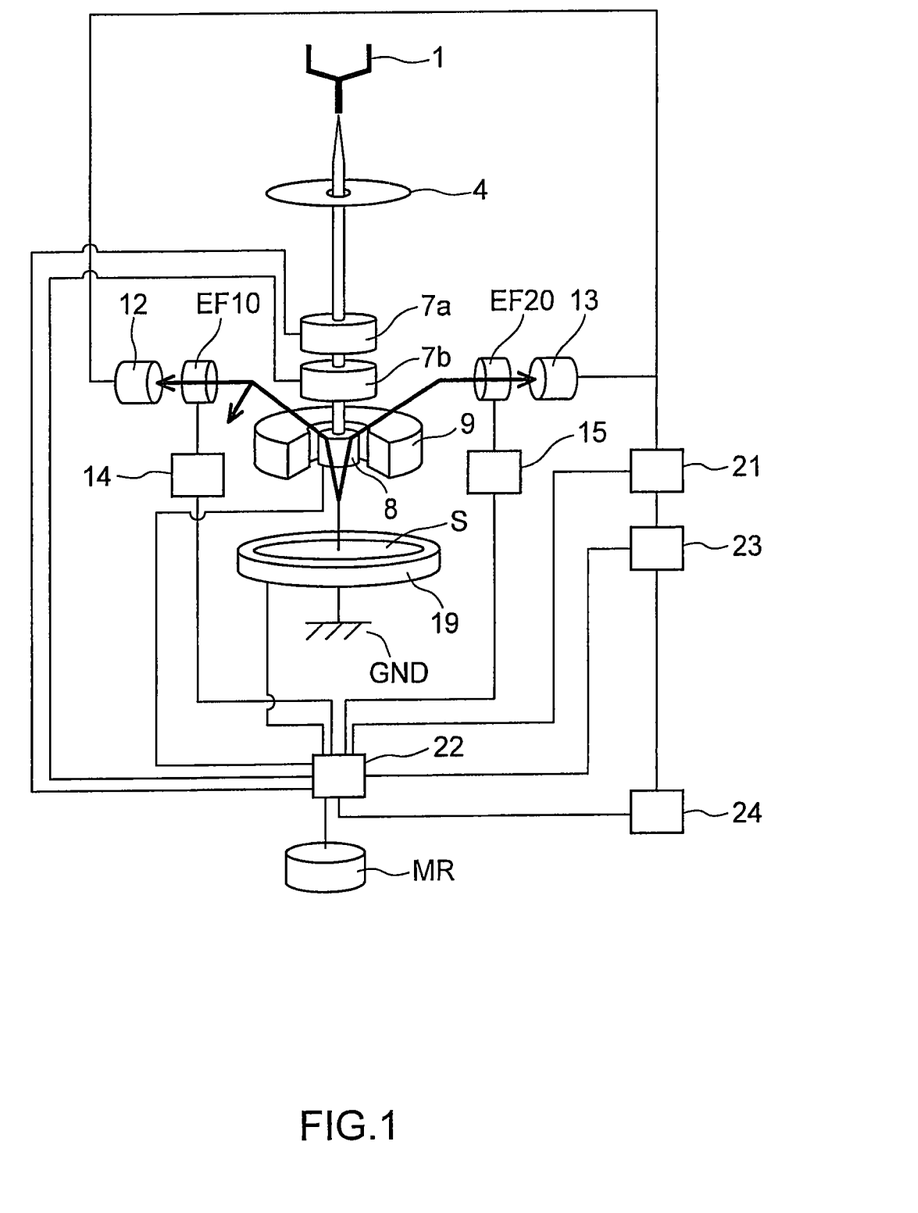
FIG. 1 is a block diagram showing an outline configuration of a defect inspection apparatus according to Embodiment 1.

FIG. 1 is a block diagram showing an outline configuration of a defect inspection apparatus according to Embodiment 1.

The defect inspection apparatus according to the present embodiment includes a filament electrode 1, a condenser lens 4, beam scan deflectors 7a and 7b, an objective lens 9, a stage 19, a Wien filter 8, energy filters EF10 and EF20, individual secondary electron/reflected electron detectors 12 and 13, variable direct-current power supplies 14 and 15, a signal processing unit 21, an image processing unit 23, a control computer 22, a memory MR, and a display unit 24.

A semiconductor substrate S is mounted on an upper surface of the stage 19, and the stage 19 receives a control signal from the control computer 22 and moves the semiconductor substrate S in a horizontal direction and a vertical direction. On a surface of the semiconductor substrate S, wiring lines WR1, WR2 . . . (see FIG. 3 and FIG. 9) as measurement targets are formed at a predetermined pitch in accordance with each die or each chip. In this embodiment, an aspect ratio of the wiring lines WR1 and WR2 is not smaller than 10. In this embodiment the wiring lines are taken for instance as inspection target patterns, but a pattern of rectangular or circular holes aligned in one predetermined direction or two directions orthogonal to each other can also be inspected besides such a line-and-space pattern. The semiconductor substrate S corresponds to, e.g., a sample in this embodiment. The stage 19 is connected to a ground potential (GND) in this embodiment. The filament electrode 1 generates an electron beam EB and applies it toward the semiconductor substrate S. In the present embodiment, the electron beam EB corresponds to, e.g., a charged beam, and the filament electrode 1 corresponds to, e.g., a charged beam irradiation unit.

The condenser lens 4 generates a magnetic field or an electric field and condenses the electron beam EB so that an appropriate beam flux can be obtained. The objective lens 9 generates, a magnetic field or an electric field and again converges the electron beam EB so that the semiconductor substrate S can be irradiated with the electron beam EB in an in-focus state.

The beam scan deflectors 7a and 7b are connected to the control computer 22, generate a magnetic field or an electric field used for deflecting the electron beam EB in accordance with a control signal supplied from the control computer 22, whereby the semiconductor substrate S is two-dimensionally scanned with the electron beam EB. The individual secondary electron/reflected electron detectors 12 and 13 are arranged in such a manner that their detection surfaces face each other so as to sandwich an optical axis of the electron beam EB at the same height from the semiconductor substrate S in this embodiment. The individual secondary electron/reflected electron detectors 12 and 13 detect secondary electrons or reflected electrons (which will be simply referred to as "secondary electrons/reflected electrons" hereinafter) generated from the semiconductor substrate S by irradiation of the electron beam EB, output signals, and supply them to the signal processing unit 21. In the present embodiment, the secondary electron/reflected electron corresponds to, e.g., a secondary charge particle or a reflected charged particle. The Wien filter 8 is connected to the control computer 22, allows the electron beam EB that passes through the condenser lens 4 and the like and is applied to the semiconductor substrate S to pass therethrough without changing a trajectory, and bends a trajectory of the secondary electrons/reflected electrons generated from the semiconductor substrate S in such a manner that the secondary electrons/reflected electrons travel toward the respective detection surfaces of the individual secondary electron/reflected electron detectors 12 and 13. In the present embodiment, the Wien filter 8 also functions as a beam splitter, and it divides the secondary electrons/reflected electrons in such a manner that substantially the same amounts of the secondary electrons/reflected electrons from the semiconductor substrate S can travel toward the respective individual secondary electron/reflected electron detectors 12 and 13 in accordance with a control signal supplied from the control computer 22. In the present embodiment, the Wien filter 8 corresponds to, e.g., a charged particle division unit.

The energy filters EF10 and EF20 are arranged between the individual secondary electron/reflected electron detectors 12 and 13 and the Wien filter 8, and they filter and selectively allow the secondary electrons/reflected electrons to pass therethrough so that the secondary electrons/reflected electrons having desired energy can enter the respective detection surfaces of the individual secondary electron/reflected electron detectors 12 and 13.

The energy filters EF10 and EF20 are connected to the variable direct-current power supplies 14 and 15.

A level of energy that allows filtering is determined in dependence on values of voltages applied from the variable direct-current power supplies 14 and 15. The variable direct-current power supplies 14 and 15 are connected to the control computer 22 and apply voltages to the energy filters EF10 and EF20. The values of the voltages applied to the energy filters EF10 and EF20 are determined in accordance with a control signal supplied from the control computer 22. In this embodiment, values of the voltages applied to the individual secondary electron/reflected electron detectors 12 and 13 correspond to, e.g., application voltage conditions different from each other and filtering conditions different from each other. Further, a pair of the energy filter EF10 and of the individual secondary electron/reflected electron detector 12 and a pair of the energy filter EF20 and of the individual secondary electron/reflected electron detector 13 correspond to, e.g., a plurality of pairs of an energy filter and a detection unit in the present embodiment. The signal processing unit 21 individually process signals supplied from the individual secondary electron/reflected electron detectors 12 and 13 in accordance with a control signal fed from the control computer 22 and creates a contrast image which reflects a potential distribution on the surface of the semiconductor substrate S (which will be referred to as a "potential contrast image" hereinafter). Information of coordinate positions of a corresponding inspection target region is given to data of the potential contrast image in accordance with each pixel. In this embodiment, in regard to the same inspection target region in the surface of the semiconductor substrate S, obtained are two images, i.e., a potential contrast image based on a signal from the individual secondary electron/reflected electron detector 12 and a potential contrast image based on a signal from the individual secondary electron/reflected electron detector 13.

The image processing unit 23 executes arithmetic processing with respect to the potential contrast image supplied from the signal processing unit 21, creates a difference image, also creates a later-described two-dimensional histogram, and makes a defect judgment in accordance with a control signal supplied from the control computer 22. The created potential contrast image, the difference image, and a defect judgment result are displayed by a display unit 24 such as a liquid crystal display.

The memory MR stores an inspection recipe in which a specific procedure of the defect inspection is written. The control computer 22 reads out the inspection recipe from the memory MR, creates the various control signals, and supplies them to the beam scan deflectors 7a and 7b, the Wien filter 8, the variable direct-current power supplies 14 and 15, the signal processing unit 21, and the image processing units 23 and 24.

In the present embodiment, the signal processing unit 21, the control computer 22, and the image processing unit 23 correspond to, e.g., an inspection unit.

A defect inspection using the defect inspection apparatus shown in FIG. 1 will now be described with reference to FIG. 2 to FIG. 6.

First, values of the voltages applied to the energy filters EF10 and EF20 are set. In this embodiment, a direct-current voltage DC=−40 V is applied to the energy filter EF10, and a direct-current voltage DC=0 V is applied to the energy filter EF20, in other words, no voltage application is set for the energy filter EF20.

Figure 3:
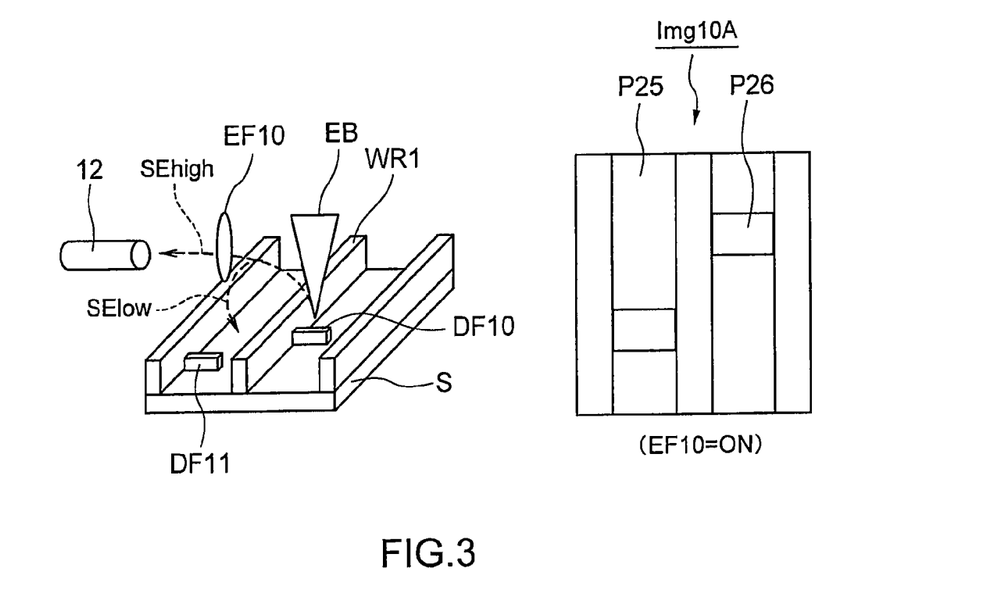
Figure 4:
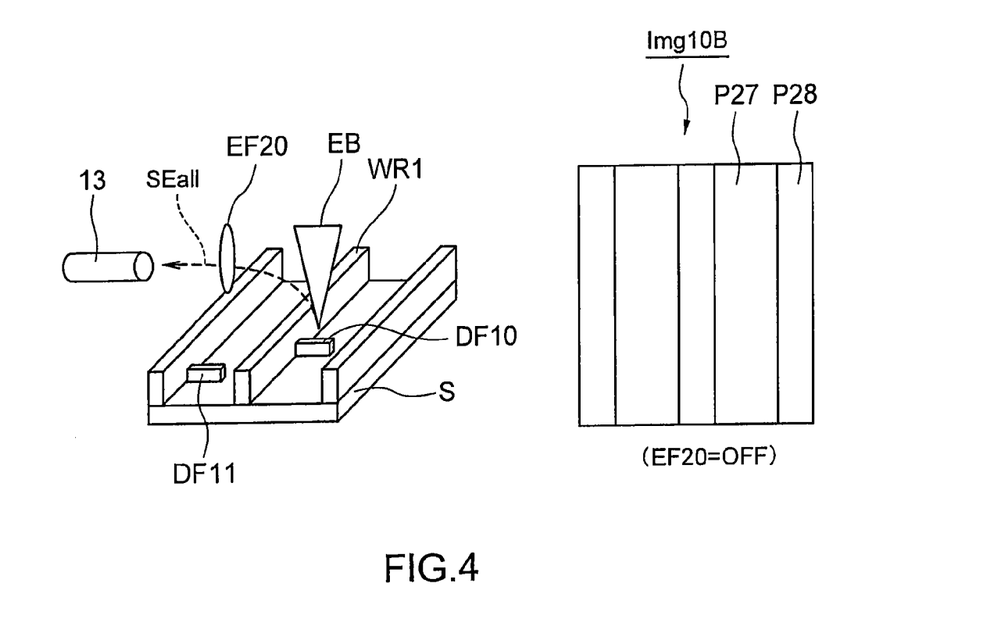
FIG. 4 is a view showing each example of a trajectory of the secondary electrons/reflected electrons and a potential contract image obtained from the same inspecting position as that in FIG. 3 when the energy filter is turned off.
Figure 5:
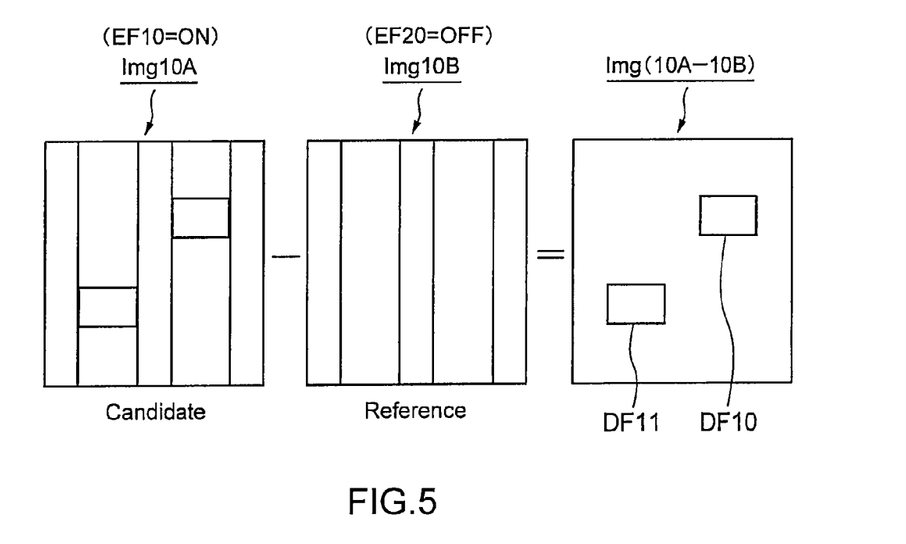
FIG. 5 is a view showing an example of a difference image of the potential contrast image.

The values of the voltages applied to the energy filters EF10 and EF20 are not restricted to these values, they are appropriately determined in accordance with a material of a matter that forms a base substance of a sample, a material, a shape, an aspect ratio, a degree of coarseness and fineness of a pattern that is an inspection target, or a material of a peripheral pattern, and they can be different from each other in such a manner that a difference can be confirmed in a potential contrast image (see FIG. 3 to FIG. 5). Therefore, as polarities of the application voltages, there can be combinations of the positive polarity and the positive polarity, the positive polarity and 0, the positive polarity and the negative polarity, 0 and the negative polarity, and the negative polarity and the negative polarity.

Then, the semiconductor substrate S having the wiring lines WR1 as an inspection target formed thereon is mounted on the stage 19. A defect type that should be detected in this embodiment is an electrical short circuit defect that is present on a bottom surface of a space region between the wiring lines WR1 having a high aspect ratio. Subsequently, the variable direct-current power supply 14 changes the direct-current voltage applied to the energy filter EF10 from DC=0 V to DC=−40 V in accordance with a control signal supplied from the control computer 22, whereby the energy filter EF10 is turned on. On the other hand, since the voltage applied to the energy filter EF20 remains as 0, the energy EF20 is maintained in an OFF state.

Figure 2:
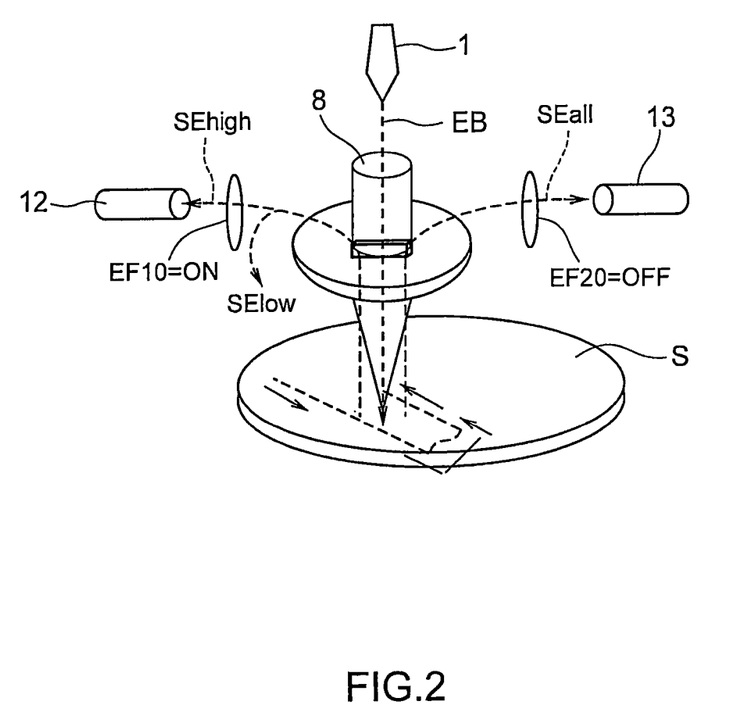
FIG. 2 is an explanatory view of a defect inspection method according to Embodiment 1.

In this state, the electron beam EB is emitted from the filament electrode 1, the stage 19 is moved as indicated by arrows in FIG. 2, and the electron beam EB is deflected by the beam scan deflectors 7a and 7b while bringing an inspection target region into view, whereby the inspection target region including the wiring line WR1 is scanned by the electron beam EB. As indicated by broken lines in FIG. 2, secondary electrons/reflected electrons generated from the semiconductor substrate S are divided into two by the Wien filter 8, respective trajectories are bent, and the secondary electrons/reflected electrons travel toward the detection surfaces of the individual secondary electron/reflected electron detectors 12 and 13.

The energy filters EF10 and EF20 are disposed on the front sides of the respective individual secondary electron/reflected electron detectors 12 and 13, and the secondary electrons/reflected electrons are filtered by these members. Since the energy filter EF20 is OFF, as shown in FIG. 4, it allows the incoming secondary electrons/reflected electrons SEall having high energy and low energy to pass therethrough and to enter the individual secondary electron/reflected electron detector 13. Since the secondary electrons/reflected electrons SEhigh having high energy are generated from a top surface, especially an edge portion of the wiring line WR1, these electrons appear as a bright spot (bright) in an obtained contrast image as shown in Img 10B in FIG. 4. On the other hand, the secondary electrons/reflected electrons SElow having low energy are generated from the space region between the wiring lines WR1, and they appear as a dark spot (dark) in the potential contrast image.

However, as indicated by reference marks DF10 and DF11 in FIG. 4, short circuit defects DF10 and DF11 are formed on a bottom portion of the space between WR1 in inspection target regions, the high-energy secondary electrons/reflected electrons SEhigh are also generated from top surfaces of these portions, but few defects can exceeds sidewalls of the wiring lines WR1 because of a height of the aspect ratio, and an amount of the low-energy secondary electrons/reflected electrons SElow generated from the wiring bottom is overwhelmingly large in particular. Since the energy filter EF20 is OFF, the secondary electrons/reflected electrons SEall having the high energy and the low energy are detected by the individual secondary electron/reflected electron detector 13, and hence a defective portion does not appear in the potential contrast image Img 10B. The potential contrast image obtained when the energy filter is OFF will be referred to as a "reference image" hereinafter.

On the other hand, since the energy filter EF10 is ON, as shown in FIG. 3, the low-energy secondary electrons/reflected electrons SElow are blocked by the energy filter EF10, and they cannot enter the individual secondary electron/reflected electron detector 12. As a result, a majority of the secondary electrons/reflected electrons is not detected from the space region between the wiring lines WR1, especially the bottom portion. Further, the high-energy secondary electrons/reflected electrons SEhigh pass through the filter EF10 and enter the detection surface of the individual secondary electron/reflected electron detector 12. Therefore, not only the secondary electrons/reflected electrons from the top surface of the wiring line WR1 but also the secondary electrons/reflected electrons from the top surfaces of the short circuit defects DF10 and DF11 are detected as a part of the high-energy secondary electrons/reflected electrons SEhigh. As a result, as shown in FIG. 3, the defects clearly appear in the potential contrast image Img 10A. The potential contrast image obtained when the energy filter is ON will be referred to as a "defect candidate image" hereinafter.

In the example depicted in FIG. 3, signal intensity of a region P25 associated with the wiring line WR1 has 120 gradations, and signal intensity of the short circuit defects DF10 and DF11 also has 120 gradations. Furthermore, in the example shown in FIG. 4, signal intensity of a region P27 associated with the wiring line WR1 has 150 gradations, and signal intensity of a region P28 associated with the bottom of the space between the wiring lines WR1 has 30 gradations.

Figure 6:
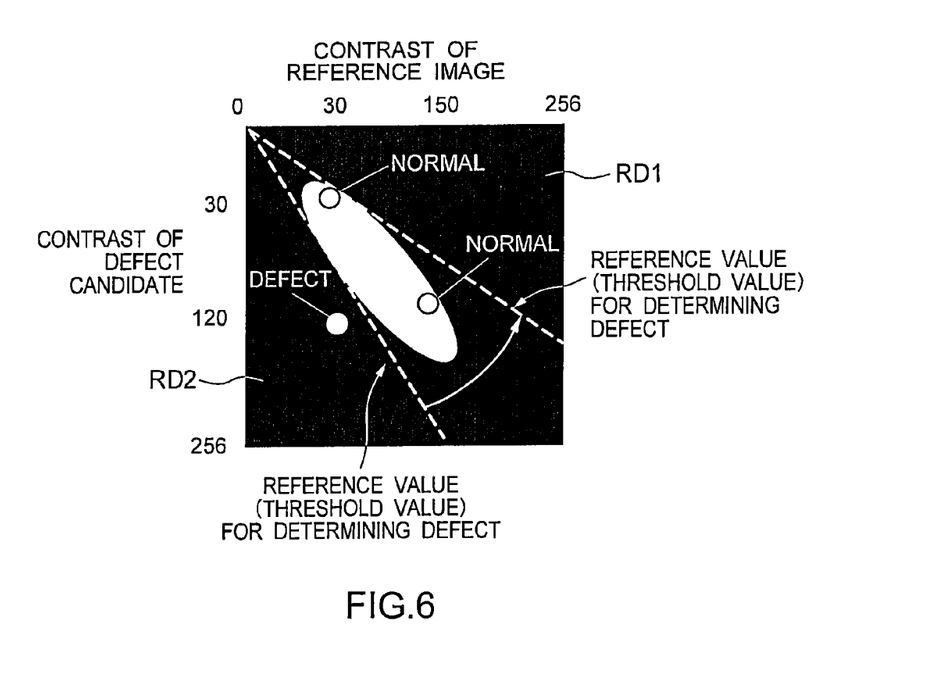
FIG. 6 is a schematic view of a histogram showing a frequency of appearance of the potential contrast images in FIG. 3 and FIG. 4 with respect to signal intensity.

As shown in FIG. 5, the image processing unit 23 creates a difference image Img (10A-10B) of the defect candidate image Img 10A and the reference image Img 10B based on arithmetic processing and thereby determines whether the defects DF10 and DF11 are present. Moreover, the image processing unit 23 also creates a two-dimensional histogram showing a frequency of appearance of each of the defect candidate image Img 10A and the reference image Img 10B with respect to the signal intensity, sets a defect determining region in the two-dimensional histogram based on a preset threshold value (a reference value), and thereby determines whether an electrical short circuit defect is present on the bottom surface of the space between the wiring lines WR1. FIG. 6 shows an example of the two-dimensional histogram obtained in relation to the defect candidate image Img 10A and the reference image Img 10. In the example of FIG. 6, the 30 gradations as the signal intensity from the space between the wiring lines WR1 detected when the energy filter EF20 is OFF are set as a threshold value, and regions defined based on this threshold value are set as defect determining regions RD1 and RD2. The image processing unit 23 determines a position at which a signal belonging to the defect determining region RD1 or RD2 as a defective position, and outputs the signal together with its coordinate position. Giving a more specific description, in the defect candidate image Img 10A and the reference image Img 10, a difference of the signal intensity on the wiring surfaces is as small as 30 gradations and, on other hand, a difference of the signal intensity at wiring short circuit positions is as large as 90 gradations. Therefore, when a reference value (a threshold value) used for determining a defect is set to 30, whether an electrical short circuit is present between the wiring lines WR1 in the high-aspect configuration can be determined.

As described above, according to the defect inspection apparatus of this embodiment, the apparatus includes the Wien filter 8 that divides the secondary electrons/reflected electrons generated from the same inspection target region from each other and allows these electrons to enter the individual secondary electron/reflected electron detectors 12 and 13 through the two energy filters EF10 and EF20 having voltages meeting different conditions applied thereto. Whether a defect is present is determined based on an intensity difference between signals obtained under different application voltage conditions, thereby enabling the defect inspection of the same wiring line in the same die at the same position. As a result, an influence of noise caused due to displacement or vibration of the stage 19, defocus of the electron beam EB, or charging due to repeated application of the electron beam EB to the same position can be eliminated, and hence the inspection can be highly accurately carried out.

(2) Defect Inspection Method

Figure 7:
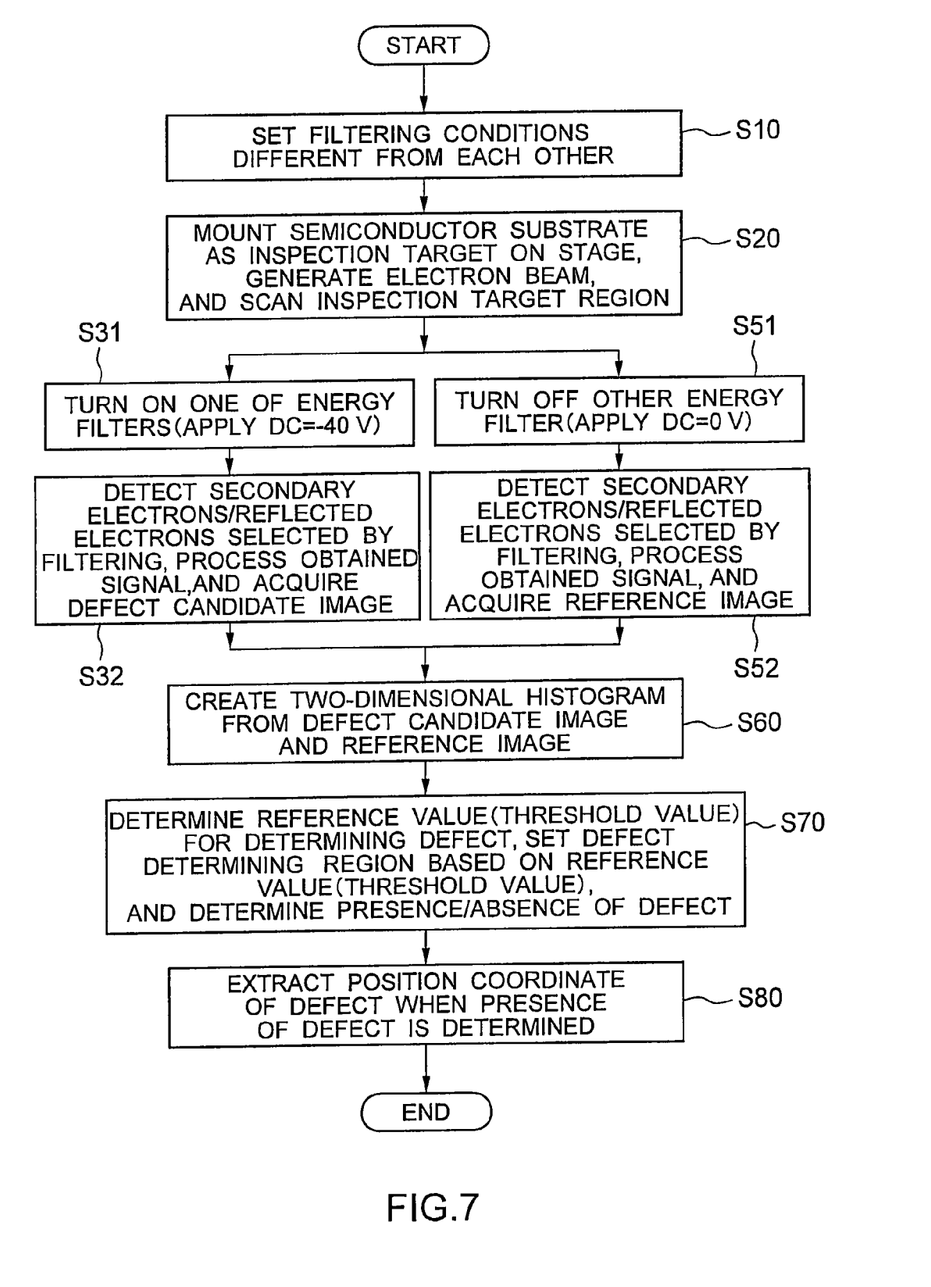
FIG. 7 is a flowchart showing an outline procedure of the defect inspection method according to Embodiment 1.

A defect inspection method according to Embodiment 1 will now be described with reference to FIG. 7. FIG. 7 is a flowchart showing an outline procedure of a defect inspection method according to the present embodiment.

First, conditions for filtering secondary electrons/reflected electrons generated from the surface of the semiconductor substrate S having the wiring line WR1 as an inspection target are set. In this embodiment, to divide the generated secondary electrons/reflected electrons by the Wien filter 8 and detect these electrons by the two individual secondary electron/reflected electron detectors 12 and 13, different filtering conditions are set (a step S10).

Here, values of voltages applied to the energy filters EF10 and EF20 are determined as filtering conditions, one is set as DC=−40 V, and the other is set as DC=0 V. Subsequently, the semiconductor substrate S is mounted on the stage 19 of the defect inspection apparatus, and the electron beam EB is generated, and the inspection target region is scanned (a step S20).

Then, of the secondary electrons/reflected electrons generated from the inspection target region, in regard to one divided by the Wien filter 8, DC=−40 V is applied to the energy filter EF10 to turn on the energy filter EF10 (a step S31), and a signal obtained by detecting the high-energy secondary electrons/reflected electrons SEhigh selected by filtering is processed to acquire the defect candidate image Img 10A (a step S32). Additionally, of the secondary electrons/reflected electrons generated from the inspection target position, in regard to the other divided by the Wien filter 8, a voltage applied to the energy filter EF20 is set to DC=0V, the energy filter EF20 is turned off (a step S51), and a signal obtained by detecting the high-energy and low-energy secondary electrons/reflected electrons SEall is processed to acquire the reference image Img 10B (a step S52).

Figure 11:
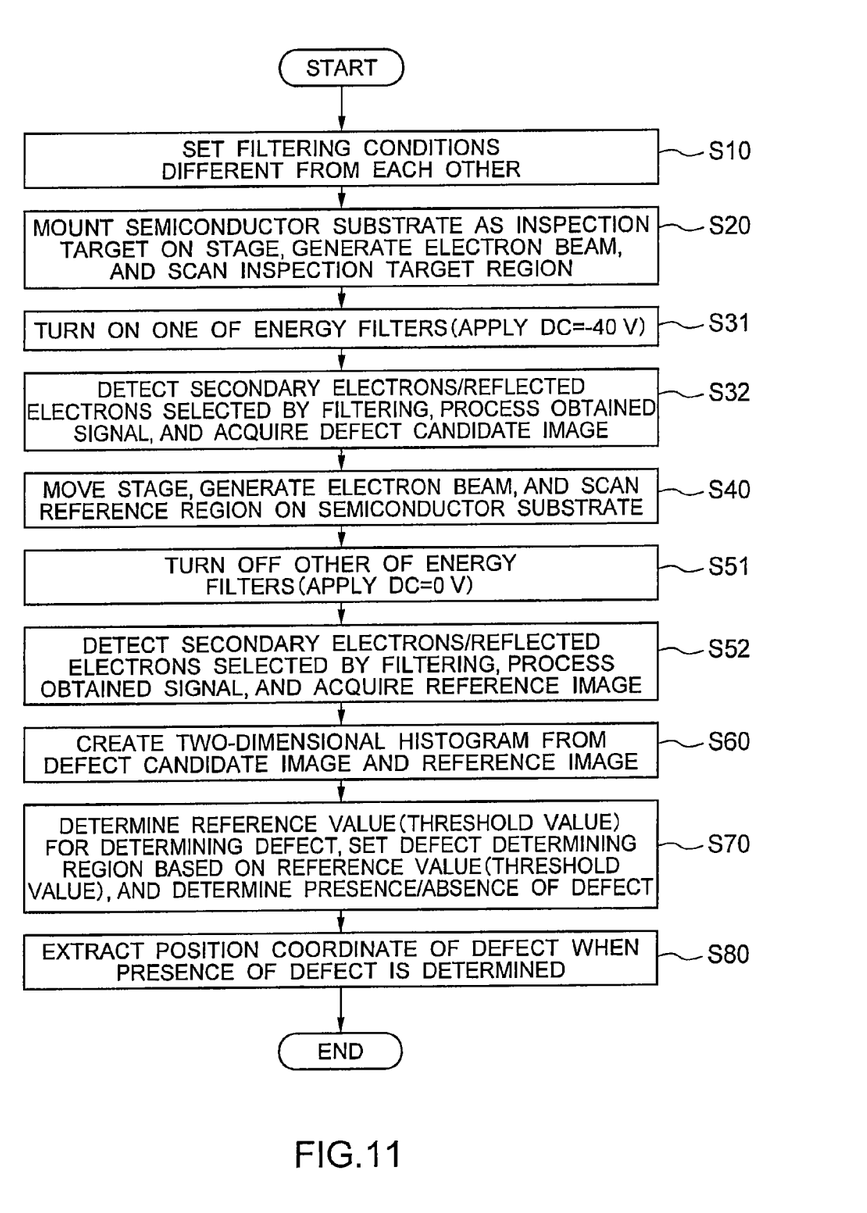
FIG. 11 is a flowchart showing an outline procedure of a defect inspection method according to Embodiment 2.

The procedures of the steps S31 to S52 can be simultaneously processed in parallel if the defect inspection apparatus depicted in FIG. 1 is used. However, it is to be noted that the procedures of the steps S31 and S32 may first be processed and then the control may advance to the procedures of the steps S51 and S52 as shown in the flowchart of FIG. 11.

Subsequently, a two-dimensional histogram is created from the defect candidate image Img 10A obtained when the energy filter EF10 is ON (DC=−40 is applied) and the reference image Img 10B obtained when the energy filter EF20 is OFF (DC=0V is applied) (a step S60).

Then, in the created two-dimensional histogram, a reference value (a threshold value) used for judging a defect is determined, the defect determining regions RD1 and RD2 based on this value are set, and whether the electrical short circuit defects DF10 and DF11 are present on the bottom surface of the space between the wiring lines is determined (a step S70).

At last, when it is determined that the defects are present, coordinates of their positions are extracted and output (a step S80).

(B) Embodiment 2

For a cell-to-cell image comparison inspection system and a die-to-die image comparison inspection system which are used for general defect inspection techniques, when it is determined that defects are present at corresponding positions in both an inspection image and a reference image, e.g., when many defects are present on a semiconductor substrate, a difference may not be detected from the image comparison, and hence "no defect" may be determined even though defects are actually present.

In the present embodiment, respective potential contrast images are acquired under filtering conditions which differ depending on each of corresponding cells or dies, and a difference image of the two obtained potential contrast images is created, thereby realizing highly accurate detection of a defect.

(1) Defect Inspection Apparatus

For the present embodiment, the defect inspection apparatus shown in FIG. 1 can also be used. However, in the present embodiment filtering conditions that differ depending on each of corresponding cells or dies are used. Thus, functions of the Wien filter 8 as a beam splitter is not used, and a direction of bending secondary electrons/reflected electrons is changed depending on acquisition of a defect candidate image and acquisition of a reference image. Therefore, in place of the Wien filter 8, two Wien filters (not shown) may be arranged between energy filters EF10 and EF20 and a semiconductor substrate S, respectively.

Figure 8:
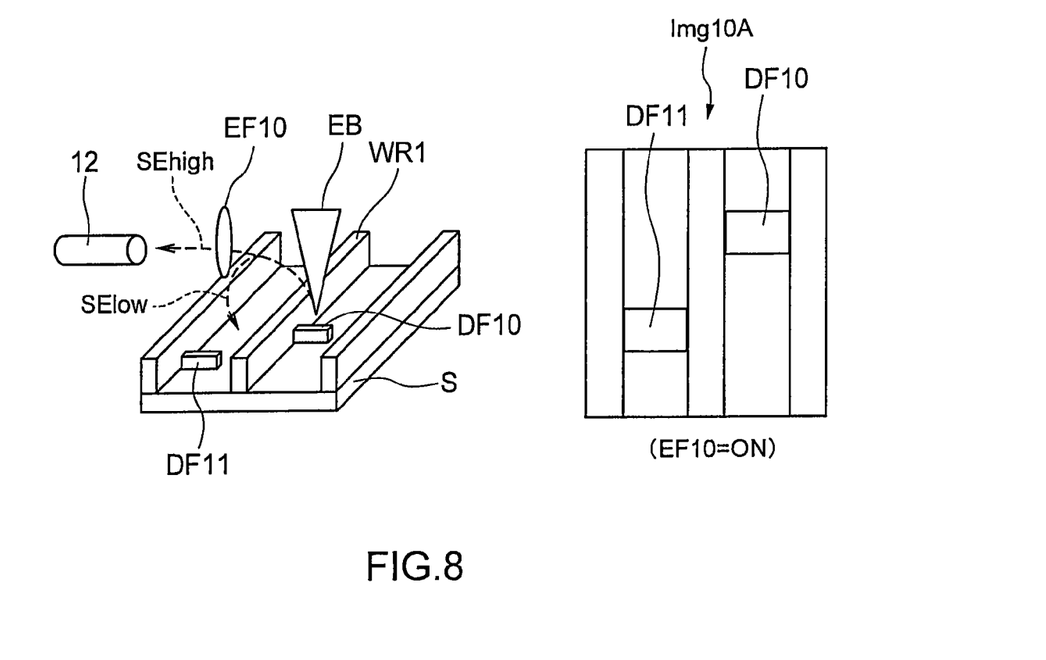

First, like Embodiment 1, a voltage DC=−40V is applied to the energy filter EF10 to turn on the energy filter EF10, and a voltage DC=0 V is applied to the energy filter EF20 to keep the energy filter EF20 in an OFF state. In this state, first, as shown in FIG. 8, an electron beam EB is applied to a wiring line WR1 in an inspection target region on the semiconductor substrate S. A trajectory of secondary electrons/reflected electrons generated from the surface of the semiconductor substrate S is controlled by the Wien filter 8 in such a manner that the secondary electrons/reflected electrons can travel toward the energy filter EF10. Since the energy filter EF10 is ON, low-energy secondary electrons/reflected electrons SElow are blocked, and a majority of these electrons is not detected by an individual secondary electron/reflected electron detector 12. On the other hand, since high-energy secondary electrons/reflected electrons SEhigh pass through the energy filter EF10, they are detected by the individual secondary electron/reflected electron detector 12. Thus, defects DF10 and DF11 appear in an obtained defect candidate image Img 10A.

Figure 9:
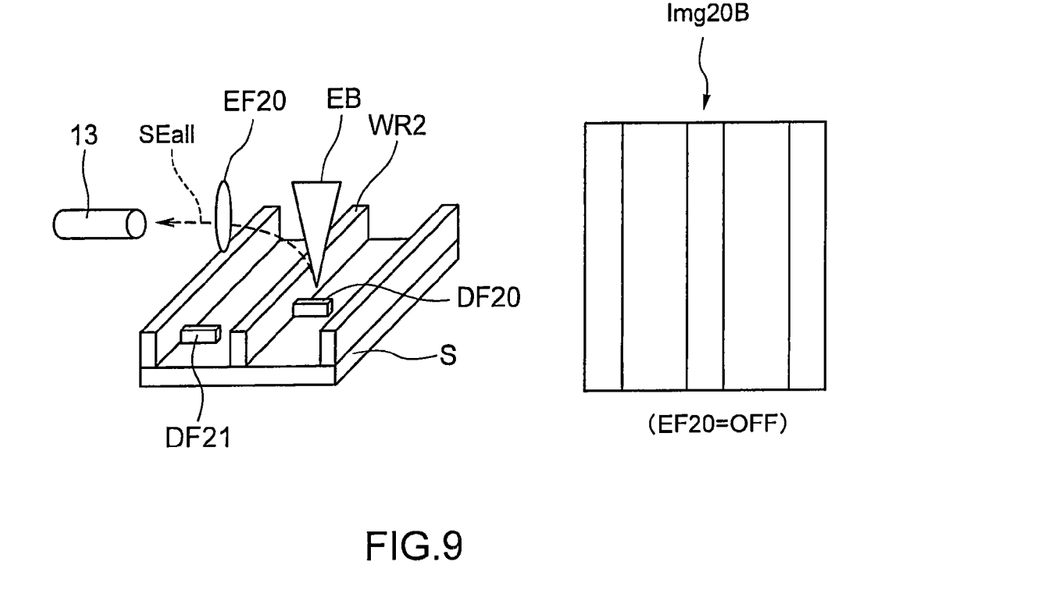
FIG. 9 is a view showing each example of a trajectory of the secondary electrons/reflected electrons and a potential contrast image obtained from an inspecting position corresponding to the inspecting position in FIG. 8 when the energy filter is turned off.

Then, the semiconductor substrate S is moved by a stage 19, and the electron beam EB is applied to a wiring line WR2 of a cell or a die associated with a cell or a die in the inspection target region on the semiconductor substrate S, which is typically an adjacent cell or die. Furthermore, a trajectory of the secondary electrons/reflected electrons generated from the surface of the semiconductor substrate S is controlled by the Wien filter 8 in such a manner that the secondary electrons/reflected electrons can travel toward the energy filter EF20. Since the energy filter EF 20 is OFF, the high-energy or low-energy secondary electrons/reflected electrons SEall pass through the energy filter EF20, and they are detected by the individual secondary electron/reflected electron detector 13. Although defects DF20 and DF21 are actually present on the wiring line WR2 in analogous with the inspection target region, the defects do not appear in an obtained reference image Img 20B.

Figure 10:
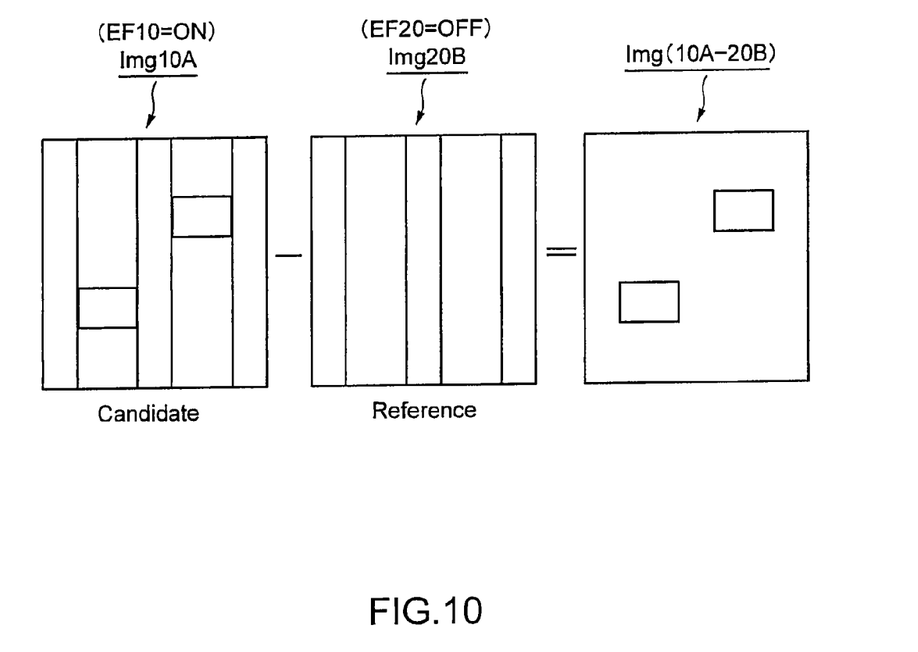
FIG. 10 is a view showing another example of a difference image of the potential contrast image.

Therefore, as shown in FIG. 10, like Embodiment 1, when the image processing unit 23 acquires a difference image Img (10A-10B) of the defect candidate image Img 10A and the reference image Img 20B, the defects DF10 and DF11 can be specified.

(2) Defect Inspection Method

A defect inspection method according to the present embodiment will now be described with reference to a flowchart of FIG. 11.

First, conditions for filtering secondary electrons/reflected electrons generated from the surface of the semiconductor substrate S having the wiring lines WR1 and WR2 as inspection targets are set. In this embodiment, filtering conditions that differ depending on acquisition of the defect candidate image Img 10A and acquisition of the reference image Img 20B are set (a step S10). Here, values of voltages applied to the energy filters 12 and 13 are determined as filtering conditions, one of the voltage is determined as DC=−40V, and the other of the same is determined as DC=0 V.

Subsequently, the semiconductor substrate S is mounted on the stage 19 of the defect inspection apparatus, and the electron beam EB is generated to scan the inspection target region (a step S20). Further, DC=−40 V is applied to the energy filter EF10 to turn on the energy filter EF10 (a step S31), and a trajectory of the secondary electrons/reflected electrons generated from the inspection target position is controlled by the Wien filter 8 in such a manner that the secondary electrons/reflected electrons can travel toward the energy filter EF10. Since the energy filter EF 10 is ON, the high-energy secondary electrons/reflected electrons SEhigh are selectively detected by filtering, and an obtained signal is processed to acquire the defect candidate image Img 10A (a step S32).

Then, the stage is moved, and the electron beam EB is applied to the wiring line WR2 on a cell or a die in a reference region adjacent to a cell or die in the inspection target region (a step S40).

Moreover, DC=0 V is applied to the energy filter EF20 to turn off the energy filter EF20 (a step S51), the high-energy and low-energy secondary electrons/reflected electrons SEall are detected, and an obtained signal is processed to acquire the reference image Img 20B (a step S52).

Subsequently, a two-dimensional histogram is created from the defect candidate image Img 10A obtained by the energy filter in the ON state (DC=−40 V is applied) and the reference image Img 20B obtained by the energy filter in the OFF state (DC=0 V is applied) (a step S60).

Then, in the created two-dimensional histogram, a reference value (a threshold value) for judging a defect is determined, and defect determining regions RD1 and RD2 based on this value are set, whereby whether electrical short circuit defects DF10 and DF11 are present on the bottom surface of the space between the wiring lines is determined (a step S70).

At last, when the defects are determined to be present, coordinates of their positions are extracted and output (a step S80).

As described above, according to Embodiment 2, even if many defects are present on the semiconductor substrate, the defects can be highly accurately detected.

According to the defect inspection apparatus of at least one embodiment described above, since different direct-current voltages are applied to the energy filters EF10 and EF20 from the variable direct-current power supplies 14 and 15, and the image processing unit 23 that determines, e.g., presence/absence of defects from an intensity difference between signals obtained from the individual secondary electron/reflected electron detectors 12 and 13 is provided, thereby inspecting a pattern in a high-aspect configuration with high accuracy.

Moreover, according to the defect inspection method of at least one embodiment described above, since performing inspection includes outputting information concerning defects of a pattern as an inspection target from an intensity difference between signals obtained under filtering conditions which are different from each other, a pattern in a high-aspect configuration can be highly accurately inspected.

Although the several embodiments according to the present inventions have been described, these embodiments have been presented as examples, and they do not intend to limit the scope of the inventions.

For example, in the foregoing embodiments, the description has been given as to the individual secondary electron/reflected electron detectors 12 and 13 that are arranged in such a manner that their detection surfaces face each other so as to sandwich an optical axis of the electron beam EB at the same height from the semiconductor substrate S. However, the number and the arrangement conformation of the individual secondary electron/reflected electron detectors are not restricted to those in the above conformation. In accordance with types of defects as detection targets, three or more individual secondary electron/reflected electron detectors may be e.g., rotationally symmetrically arranged around an optical axis. In contrast, a dome-like omnidirectional detector may be further provided and the Wien filter 8 may divide the secondary electrons/reflected electrons in such a manner that an amount of the secondary electrons/reflected electrons can be equivalent in respective directions.

Additionally, although the electrical short circuit defects DF10, DF11, DF20, and DF21 have been described as the inspection target defects, the present inventions are not restricted thereto, and contamination that is deposited in the space between the wiring lines may also be an inspection target, as long as the high-energy secondary electrons/reflected electrons are generated by irradiation of the electron beam EB, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A defect inspection apparatus comprising: a charged beam irradiation unit configured to generate a charged beam and irradiate a sample comprising a pattern as an inspection target thereon with the generated charged beam;
   a detection unit configured to detect secondary charged particles or reflected charged particles generated from the sample by irradiation of the charged beam and to output a signal;
   an energy filter located between the detection unit and the sample, the energy filter being configured to selectively allow the secondary charged particles or the reflected charged particles with energy associated with an applied voltage to pass therethrough; and
   an inspection unit configured to apply voltages different from each other to the energy filter and output information concerning a defect of the pattern from an intensity difference between signals obtained under application voltage different from each other and wherein a plurality of pairs of the energy filter and the detection unit are provided.

2. The apparatus of claim 1,
   wherein
   the apparatus further comprises a charged particle division unit configured to divide the secondary particles or the reflected particles in accordance with the number of pairs and to control each trajectory in such a manner that the divided charged particles enter each detection unit.

3. The apparatus of claim 1,
   wherein the inspection unit is configured to process the signal, acquire a potential contrast image in accordance with each of the application voltage different from each other, create a two-dimensional histogram representing a frequency of appearance with respect to signal intensity at a same inspection target position by plotting a gradation value of the potential contrast image acquired in accordance with each of the application voltage different from each other, set a defect determining region based on a preset threshold value in the two-dimensional histogram, and determine that a defect is present in the pattern when the signal is included in the defect determining region.

4. The apparatus of claim 3,
   wherein, when a defect is determined to be present in the pattern, the inspection unit is configured to output information of a coordinate position of a signal belonging to the defect determining region.

5. The apparatus of claim 1, the apparatus further comprises a trajectory control unit configured to control a trajectory of the secondary charged particles or the reflected charged particles in such a manner that the secondary charge particles or the reflected charged particles enter each detection unit.

6. The apparatus of claim 1, wherein a trajectory control unit associated with each pair of the energy filter and the detection unit is provided.

7. The apparatus of claim 6, wherein the trajectory control unit is provided in accordance with each pair of the energy filter and the detection unit.

8. The apparatus of claim 1, wherein the inspection unit is configured to process the signal, acquire a potential contrast image in accordance with each of the application voltage different from each other, create a two-dimensional histogram representing a frequency of appearance with respect to signal intensity at inspection target positions associated with each other in different cells or dies by plotting a gradation value of the potential contrast image acquired in accordance with each of the application voltage different from each other, set a defect determining region based on a preset threshold value in the two-dimensional histogram, and determines that a defect is present in the pattern when the signal is included in the defect determining region.

9. The apparatus of claim 8, wherein, when a defect is determined to be present in the pattern, the inspection unit is configured to output information of a coordinate position of a signal belonging to the defect determining region.

10. The apparatus of claim 1, wherein the detection units each comprise two individual detectors arranged in such a manner that respective detection surfaces thereof face each other to sandwich an optical axis of the charged beam therebetween.

11. The apparatus of claim 1, wherein the detection units each comprise three or more individual detectors which are rotationally symmetrically arranged around an optical axis of the charged beam.

12. The apparatus of claim 1, wherein the voltages different from each others are selected from combinations of a positive polarity and a positive polarity, the positive polarity and 0, the positive polarity and a negative polarity, 0 and the negative polarity, and the negative polarity and the negative polarity.

13. The apparatus of claim 1, wherein an aspect ratio of the pattern is not smaller than 10, and each detection unit detects charged particles other than charged particles from a bottom portion between spaces in the pattern.

14. A defect inspection method comprising: generating a charged beam and irradiating a sample comprising a pattern thereon as an inspection target with the charged beam;
performing filtering under filtering conditions different from each other so as to allow passage of secondary charged particles or reflected charge particles with desired energy generated from the sample by irradiation of the charged beam;
detecting the secondary charged particles or the reflected charged particles selected by the filtering, and outputting a signal; and
outputting information concerning a defect of the pattern from an intensity difference between signals obtained under the filtering conditions different from each other, wherein the filtering under the filtering conditions different from each other and the detection are simultaneously carried out.

15. The method of claim 14, further comprising dividing the secondary particles or the reflected particles in accordance with a number of pairs and controlling each trajectory in such a manner that the divided charged particles enter each detecting.

16. The method of claim 14, wherein the performing inspection comprises:
processing the signal to acquire a potential contrast image in accordance with each of an application voltage different from each other,
creating a two-dimensional histogram representing a frequency of appearance with respect to signal intensity at a same inspection target position by plotting a gradation value of the potential contrast image acquired in accordance with each of the application voltage different from each other,
setting a defect determining region based on a preset threshold value in the two-dimensional histogram, and
determining that a defect is present in the pattern when the signal is included in the defect determining region.

17. The method of claim 16, further comprising, when a defect is determined to be present in the pattern, outputting information of a coordinate position of a signal belonging to the defect determining region.

18. The method of claim 14, wherein the performing inspection comprises:
processing the signal, acquire a potential contrast image in accordance with each of an application voltage different from each other,
creating a two-dimensional histogram representing a frequency of appearance with respect to signal intensity at inspection target positions associated with each other in different cells or dies by plotting a gradation value of the potential contrast image acquired in accordance with each of the application voltage different from each other,
setting a defect determining region based on a preset threshold value in the two-dimensional histogram, and
determining that a defect is present in the pattern when the signal is included in the defect determining region.

19. The method of claim 18, wherein the performing inspection comprises, when a defect is determined to be present in the pattern, outputting information of a coordinate position of a signal belonging to the defect determining region.

* * * * *